(12) United States Patent
Ko et al.

(10) Patent No.: US 12,745,665 B2
(45) Date of Patent: Sep. 22, 2026

(54) SUBSTRATE AND METHOD OF MANUFACTURING THE SAME

(71) Applicant: SAMSUNG ELECTRO-MECHANICS CO., LTD., Suwon-si (KR)

(72) Inventors: Chanhoon Ko, Suwon-si (KR); Chulmin Lee, Suwon-si (KR); Inhwan Oh, Suwon-si (KR); Kyounghee Lim, Suwon-si (KR); Sohyun Bae, Suwon-si (KR); Sanghoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 452 days.

(21) Appl. No.: 18/202,519

(22) Filed: May 26, 2023

(65) Prior Publication Data

US 2024/0170420 A1 May 23, 2024

(30) Foreign Application Priority Data

Nov. 18, 2022 (KR) ........................ 10-2022-0155643

(51) Int. Cl.
*H01L 23/00* (2006.01)
*H10W 72/00* (2026.01)
*H10W 72/90* (2026.01)

(52) U.S. Cl.
CPC ......... *H10W 72/90* (2026.01); *H10W 72/019* (2026.01); *H10W 72/01935* (2026.01); *H10W 72/01951* (2026.01); *H10W 72/9415* (2026.01)

(58) Field of Classification Search
CPC . H01L 24/05; H01L 24/03; H01L 2224/0346; H01L 2224/03632; H01L 2224/05572; H01L 23/49822; H01L 23/49827; H01L 21/486; H01L 23/49811; H01L 23/49838; H05K 1/112;
(Continued)

(56) References Cited

U.S. PATENT DOCUMENTS 6,326,559 B1 12/2001 Yoshioka et al.
11,205,618 B2 * 12/2021 Yang ................. H01L 21/76843
(Continued)

FOREIGN PATENT DOCUMENTS

JP 2000-022337 A 1/2000
JP 2015-097253 A 5/2015
(Continued)

OTHER PUBLICATIONS

Office Action issued on Jan. 21, 2026 in Korean Patent Application No. 10-2022-0155643 with English translation.

*Primary Examiner* — Fernando L Toledo
*Assistant Examiner* — Shawn Shaw Muslim
(74) *Attorney, Agent, or Firm* — Morgan, Lewis & Bockius LLP

(57) ABSTRACT

A substrate includes: a first insulating layer; a second insulating layer disposed on the first insulating layer; and a via hole including a lower hole formed in the first insulating layer, and an upper hole formed in the second insulating layer and connected to the lower hole, in which a width of an upper side of the lower hole is larger than a width of a lower side of the lower hole, and a width of an upper side of the upper hole is larger than a width of a lower side of the upper hole.

26 Claims, 14 Drawing Sheets

(58) Field of Classification Search
CPC ....... H05K 1/0313; H05K 2201/09509; H05K 2201/09827; H05K 2201/09854; H05K 3/0035; H05K 3/0038; H05K 1/0366; H05K 1/115; H05K 3/421; H05K 2201/09472; H05K 2203/108; H05K 3/0026; H05K 3/42
See application file for complete search history.

(56) References Cited

U.S. PATENT DOCUMENTS

| | | | | |
|---|---|---|---|---|
| 2009/0173530 | A1* | 7/2009 | Sakamoto | H10W 70/05 29/846 |
| 2010/0006334 | A1* | 1/2010 | Takenaka | H05K 3/465 174/262 |
| 2016/0249463 | A1 | 8/2016 | Yoshida | |
| 2021/0082829 | A1 | 3/2021 | Yang et al. | |
| 2022/0367391 | A1* | 11/2022 | Wei | H10F 39/018 |
| 2023/0230849 | A1* | 7/2023 | Cheng | H10W 70/614 438/459 |

FOREIGN PATENT DOCUMENTS

| | | | |
|---|---|---|---|
| KR | 10-2012-0012732 | A | 2/2012 |
| KR | 10-2020-0013471 | A | 2/2020 |

* cited by examiner

SUBSTRATE AND METHOD OF MANUFACTURING THE SAME

CROSS-REFERENCE TO RELATED APPLICATION

This application claims priority to and the benefit of Korean Patent Application No. 10-2022-0155643 filed in the Korean Intellectual Property Office on Nov. 18, 2022, the entire contents of which are incorporated herein by reference.

BACKGROUND

1. Field

The present disclosure relates to a substrate and a method of manufacturing the same.

2. Description of the Related Art

A via hole is formed in a substrate to electrically connect layers of the substrate. After the via hole is formed in the substrate, a metal layer is formed in the via hole to connect a pad part disposed below the via hole and a pad part disposed above the via hole.

As electronic devices including mobile phones in IT fields are reduced in size, sizes of electronic components integrated on the substrates are reduced, and sizes of the via holes formed in the substrates are reduced.

As the size of the via hole is reduced, an area of a region occupied by the metal layer stacked in the via hole is decreased. Therefore, in case that no metal layer is partially formed in a part of the via hole, there may occur a problem in that the pad parts disposed below and above the via hole cannot be electrically connected.

However, when the size of the via hole is increased, sizes of the pad parts disposed above and below the via hole are also increased, and thus a density of the electronic components connected through the pad parts formed on the substrate is decreased, which makes it difficult to miniaturize the electronic component.

The above information disclosed in this Background section is only for enhancement of understanding of the background of the described technology, and therefore it may contain information that does not form the prior art that is already known in this country to a person of ordinary skill in the art.

SUMMARY

The described technology has been made in an effort to provide a substrate and a method of manufacturing the same, the substrate having a via hole and capable of reducing a defect of a via layer caused by a decrease in width of the via hole and preventing an increase in areas of pad parts disposed below and above the via hole.

However, the object to be achieved by the embodiments is not limited to the above-mentioned object but may be variously expanded without departing from the technical spirit of the embodiments.

In one embodiment, a substrate may include: a first insulating layer; a second insulating layer disposed on the first insulating layer; and a via hole including a lower hole formed in the first insulating layer, and an upper hole formed in the second insulating layer and connected to the lower hole, in which a width of an upper side of the lower hole is larger than a width of a lower side of the lower hole, and a width of an upper side of the upper hole is smaller than a width of a lower side of the upper hole.

The substrate may further include: a lower conductive pattern disposed at a lower portion of the first insulating layer; and an upper conductive pattern disposed above the second insulating layer, in which the lower hole has a first width at a portion where the lower hole adjoins the lower conductive pattern, in which the via hole has a second width between the lower conductive pattern and the upper conductive pattern, in which the upper hole has a third width at a portion where the upper hole adjoins the upper conductive pattern, and in which each of the first width and the third width is smaller than the second width.

The second width may be largest at an interface between the first insulating layer and the second insulating layer.

The substrate may further include a connection conductive pattern disposed in the via hole and connected to the lower conductive pattern and the upper conductive pattern.

A width of the lower hole may increase from below to above, and a width of the upper hole may decrease from below to above.

The first insulating layer may include prepreg and be impregnated with fiberglass.

The first insulating layer may include a reinforcing material, and the second insulating layer may include no reinforcing material.

The second insulating layer may include resin.

The substrate may further include a conductive film disposed on the second insulating layer, and the upper hole may be formed in the second insulating layer and the conductive film.

A width of the upper hole formed in the conductive film may not be smaller than a width of the upper hole formed in the second insulating layer.

In another embodiment, a method of manufacturing a substrate may include: stacking a first insulating layer; forming a second insulating layer on the first insulating layer; forming a sub-hole by primarily removing the second insulating layer and the first insulating layer by emitting a first laser; and forming a via hole by secondarily removing the second insulating layer and the first insulating layer by emitting a second laser different from the first laser.

The first laser may be a YAG laser, and the second laser may be a carbon dioxide gas laser.

The first insulating layer may be impregnated with fiberglass, and the fiberglass of the first insulating layer may be processed in the emitting of the second laser.

The method may further include: forming a lower conductive pattern below the first insulating layer; forming a connection conductive pattern in the via hole, the connection conductive pattern being connected to the lower conductive pattern; and forming an upper conductive pattern above the via hole, the upper conductive pattern being connected to the connection conductive pattern.

The forming of the connection conductive pattern may include: stacking a plating seed layer on an upper surface of the lower conductive pattern and an inner wall of the via hole; and performing plating by using the plating seed layer.

The method may further include forming a conductive film on the second insulating layer, and the sub-hole and the via hole may be formed in the conductive film.

The method may further include removing the conductive film before the plating seed layer is formed.

The method may further include removing the conductive film, which does not overlap the upper conductive pattern, after the upper conductive pattern is formed.

The via hole may include a lower hole formed in the first insulating layer, and an upper hole formed in the second insulating layer, a width of the lower hole may increase from below to above, and a width of the upper hole may decrease from below to above.

A width of the via hole may be largest at an interface between the first insulating layer and the second insulating layer.

Still in another embodiment, a substrate may include: at least one insulating layer; a lower conductive pattern and an upper conductive pattern disposed at a lower portion and an upper portion of the at least one insulating layer, respectively; and a connection conductive pattern penetrating through the at least one insulating layer to be connected to the lower and upper conductive patterns, in which a width of a middle portion of the connection conductive pattern is larger than widths of upper and lower portions of the connection conductive pattern.

The substrate may further include a via hole in which the connection conductive pattern is disposed, and the via hole may include a lower hole and an upper hole connected to each other.

The at least one insulating layer may include a first insulating layer and a second insulating layer stacked on one another, In which the lower hole is formed in the first insulating layer and the upper hole is formed in the second insulating layer.

A width of the via hole may be largest at an interface between the first insulating layer and the second insulating layer.

A largest width of the connection conductive pattern may be closer to an interface between the connection conductive pattern and the upper conductive pattern than an interface between the connection conductive pattern and the lower conductive pattern.

A width of the connection conductive pattern at an interface between the connection conductive pattern and the upper conductive pattern may be larger than a width of the connection conductive pattern at an interface between the connection conductive pattern and the lower conductive pattern.

The lower conductive pattern may be embedded in the lower portion of the at least one insulating layer, and the upper conductive pattern may be disposed above the upper portion of the at least one insulating layer.

The substrate may further include a conductive film disposed between the at least one insulating layer and the upper conductive pattern.

According to the embodiments, it is possible to provide the substrate and the method of manufacturing the same, the substrate having the via hole and capable of reducing a defect of the connection conductive pattern in the via hole caused by a decrease in width of the via hole and preventing an increase in areas of the pad parts disposed below and above the via hole.

However, the effects of the embodiments are not limited to the above-mentioned effects but may be variously expanded without departing from the spirit and scope of the present disclosure.

BRIEF DESCRIPTION OF THE DRAWINGS

FIG. 1 is a cross-sectional view of a substrate according to an embodiment.

FIGS. 2 to 6 are cross-sectional views illustrating a method of manufacturing the substrate according to the embodiment.

DETAILED DESCRIPTION

Figure 2:
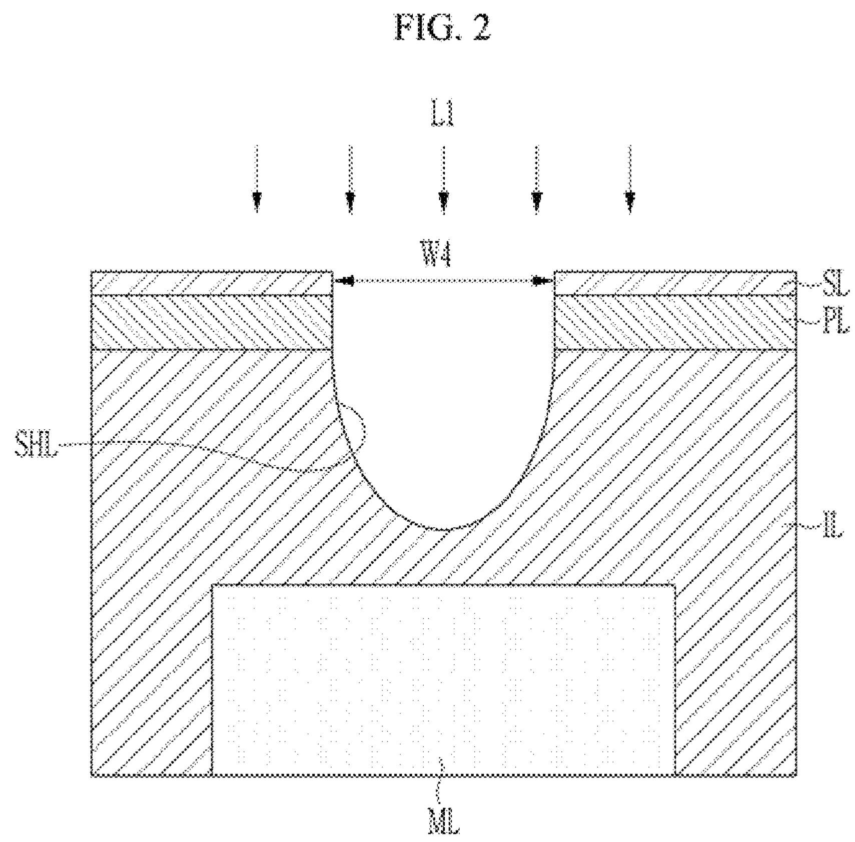

Hereinafter, several embodiments will be described in detail with reference to the accompanying drawings so that those with ordinary skill in the art to which the present disclosure pertains may easily carry out the embodiments. The present disclosure may be implemented in various different ways and is not limited to the embodiments described herein.

A part irrelevant to the description will be omitted to clearly describe the present disclosure, and the same or similar constituent elements will be designated by the same reference numerals throughout the specification.

In addition, it should be interpreted that the accompanying drawings are provided only to allow those skilled in the art to easily understand the embodiments disclosed in the present specification, and the technical spirit disclosed in the present specification is not limited by the accompanying drawings, and includes all alterations, equivalents, and alternatives that are included in the spirit and the technical scope of the present disclosure.

In addition, a size and thickness of each constituent element illustrated in the drawings are arbitrarily shown for convenience of description, but the present disclosure is not limited thereto. In order to clearly describe several layers and regions, thicknesses thereof are enlarged in the drawings. In the drawings, the thicknesses of some layers and regions are exaggerated for convenience of description.

In addition, when one component such as a layer, a film, a region, or a plate is described as being positioned "above" or "on" another component, one component can be positioned "directly on" another component, and one component can also be positioned on another component with other components interposed therebetween. On the contrary, when one component is described as being positioned "directly on" another component, there is no component therebetween. In addition, when a component is described as being positioned "above" or "on" a reference part, the component may be positioned "above" or "below" the reference part, and this configuration does not necessarily mean that the component is positioned "above" or "on" the reference part in a direction opposite to gravity.

Throughout the specification, unless explicitly described to the contrary, the word "comprise/include" and variations such as "comprises/includes" or "comprising/including" will be understood to imply the inclusion of stated elements, not the exclusion of any other elements.

Throughout the specification, the word "in a plan view" means when an object is viewed from above, and the word "in a cross-sectional view" means when a cross section made by vertically cutting an object is viewed from a lateral side.

In addition, throughout the specification, when one constituent element is referred to as being "connected to" another constituent element, one constituent element can be "directly connected to" the other constituent element, and one constituent element can also be "indirectly connected to," "physically connected to," or "electrically connected to" the other element with other elements therebetween. Further, the constituent elements are defined as different names according to positions or functions thereof, but the constituent elements may be integrated.

Hereinafter, various embodiments and modified examples will be described in detail with reference to the drawings.

Figure 1:
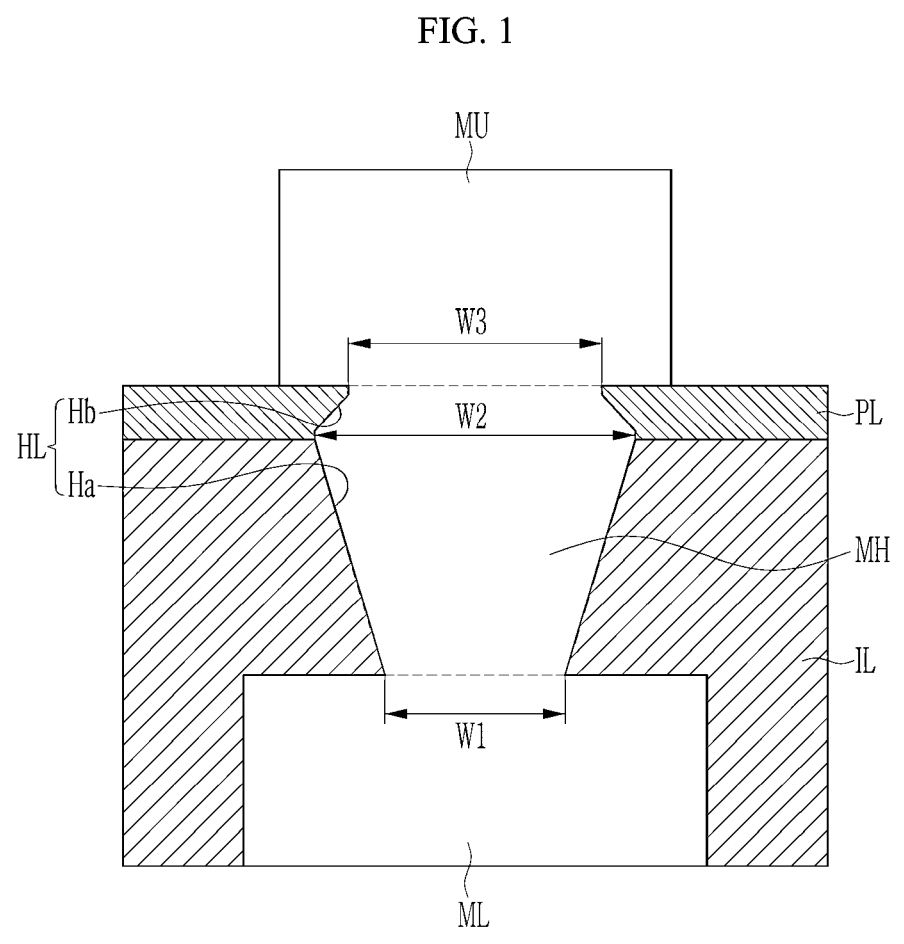

A substrate according to the embodiment will be described with reference to FIG. 1. FIG. 1 is a cross-sectional view of a substrate according to an embodiment.

Referring to FIG. 1, the substrate according to the embodiment may include a lower conductive pattern ML, a first insulating layer IL disposed on the lower conductive pattern ML, a second insulating layer PL disposed on the first insulating layer IL, an upper conductive pattern MU disposed on the second insulating layer PL, a via hole HL formed in the first insulating layer IL and the second insulating layer PL, and a connection conductive pattern MH disposed in the via hole HL.

The lower conductive pattern ML and the upper conductive pattern MU may be connected to each other through the connection conductive pattern MH disposed in the via hole HL formed in the first insulating layer IL and the second insulating layer PL.

The first insulating layer IL and the second insulating layer PL may include different materials.

The first insulating layer IL may include a reinforcing material, and the second insulating layer PL may include no reinforcing material.

The first insulating layer IL may include an insulating material. The first insulating layer IL may include prepreg (PPG) and be impregnated with fiberglass.

The first insulating layer IL may include an insulating material such as an Ajinomoto build-up film (ABF) and include a filler.

However, the first insulating layer IL is not limited thereto. The first insulating layer IL may include various insulating materials.

The second insulating layer PL may include resin. The second insulating layer PL may include primer resin and include one or more selected from naphthalene-based epoxy resin, bisphenol A epoxy resin, phenol novolak epoxy resin, cresol novolak epoxy resin, rubber-modified epoxy resin, and phosphorous-based epoxy resin. However, the embodiment is not limited thereto. The second insulating layer PL may include various resins.

The via hole HL formed in the first insulating layer IL and the second insulating layer PL may include a lower hole Ha formed in the first insulating layer IL while adjoining the lower conductive pattern ML, and an upper hole Hb formed in the second insulating layer PL while adjoining the upper conductive pattern MU. The lower hole Ha and the upper hole Hb are connected to each other.

The lower hole Ha has a first width W1 at a portion where the lower hole Ha adjoins the lower conductive pattern ML. A width of the lower hole Ha may increase in a direction toward the upper conductive pattern MU from the portion where the lower hole Ha adjoins the lower conductive pattern ML. According to the illustrated embodiment, the configuration is illustrated in which the width of the lower hole Ha continuously and gradually increases in the direction toward the upper conductive pattern MU from the portion where the lower hole Ha adjoins the lower conductive pattern ML. However, the embodiment is not limited thereto. A sidewall of the lower hole Ha may include a partially protruding portion, such that the lower hole Ha may include a portion having upper and lower sides, the upper side being smaller in width than the lower side.

The via hole HL may have a second width W2 at an interface portion between the first insulating layer IL and the second insulating layer PL where the lower hole Ha and the upper hole Hb meet. A width of the upper hole Hb formed in the second insulating layer PL may decrease in a direction toward the upper conductive pattern MU. The upper hole Hb may have a third width W3 at a portion where the upper hole Hb adjoins the upper conductive pattern MU. According to the illustrated embodiment, the configuration is illustrated in which the width of the upper hole Hb continuously and gradually decreases in the direction toward the upper conductive pattern MU. However, the embodiment is not limited thereto. A sidewall of the upper hole Hb may include a partially protruding portion, such that the upper hole Hb may include a portion having upper and lower sides, the upper side being larger in width than the lower side.

The first width W1 and the third width W3 of the via hole HL may be almost equal to each other. Alternatively, the first width W1 and the third width W3 may be different from each other.

According to the substrate according to the present embodiment, the via hole HL may include the lower hole Ha formed in the first insulating layer IL, and the upper hole Hb formed in the second insulating layer PL. The lower hole Ha may have the first width W1 at the portion where the lower hole Ha adjoins the lower conductive pattern ML. The via hole HL may have the second width W2 at the interface portion between the first insulating layer IL and the second insulating layer PL where the lower hole Ha and the upper hole Hb meet. The upper hole Hb formed in the second insulating layer PL may have the third width W3 at the portion where the upper hole Hb adjoins the upper conductive pattern MU. The second width W2 may be larger than the first width W1 and the third width W3. The width of the lower hole Ha may increase in the direction toward the upper conductive pattern MU from the portion where the lower hole Ha adjoins the lower conductive pattern ML. The width of the upper hole Hb may decrease in the direction toward the upper conductive pattern MU.

As described above, the via hole HL may have the relatively small first and third widths W1 and W3 at the portions where the via hole HL adjoins the lower and upper conductive patterns ML and MU. The via hole HL may have the relatively large second width W2 in the via hole HL. Therefore, the connection conductive pattern MH formed in the via hole HL may be formed in the portion having the relatively large second width W2, thereby preventing the occurrence of disconnection or the like. The lower conductive pattern ML and the upper conductive pattern MU, which are connected to each other through the connection conductive pattern MH formed in the via hole HL, may cover the via hole HL while having the small widths, thereby reducing an area of the lower conductive pattern ML embedded in the first insulating layer IL and reducing an area of the upper conductive pattern MU formed on the second insulating layer PL.

According to the substrate according to the present embodiment, a decrease in width of the interior of the via hole HL may be prevented. Therefore, it is possible to reduce a defect of the connection conductive pattern MH caused by the decrease in width of the interior of the via hole HL. Further, it is possible to prevent the increase in areas of the lower and upper conductive patterns ML and MU disposed below and above the via hole.

Then, a method of manufacturing the substrate according to the embodiment will be described with reference to FIGS. 1 and 2 to 6. FIGS. 2 to 6 are cross-sectional views illustrating the method of manufacturing the substrate according to the embodiment.

Referring to FIG. 2, the lower conductive pattern ML is formed, the first insulating layer IL is stacked on the lower conductive pattern ML, the second insulating layer PL is formed on the first insulating layer IL, a conductive film SL is formed on the second insulating layer PL, and then the conductive film SL, the second insulating layer PL, and the first insulating layer IL are removed by emitting a first laser L1, such that a sub-hole SHL is formed in the conductive film SL, the second insulating layer PL, and the first insulating layer IL.

The conductive film SL may be, but not limited to, a metal coil layer, for example, a copper coil layer.

The first laser L1 may be a YAG laser.

An uppermost portion of the sub-hole SHL may have a fourth width W4, the sub-hole SHL may be formed in the conductive film SL, the second insulating layer PL, and a part of the first insulating layer IL, the lower conductive pattern ML may not be exposed through the sub-hole SHL, and a part of the first insulating layer IL may remain on the lower conductive pattern ML.

Figure 3:
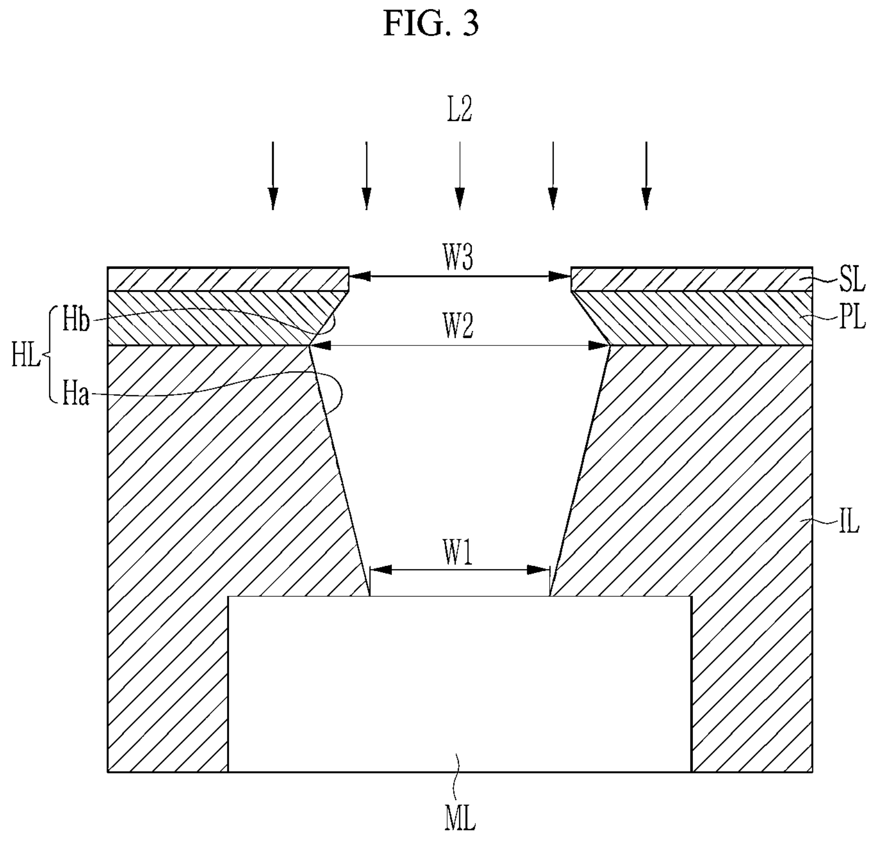

Next, referring to FIG. 3, the conductive film SL, the second insulating layer PL, and the first insulating layer IL are additionally removed by emitting a second laser L2, such that the via hole HL is formed in the conductive film SL, the second insulating layer PL, and the first insulating layer IL so that the lower conductive pattern ML is exposed.

The second laser L2 may be a carbon dioxide ($CO_2$) gas laser. The fiberglass in the first insulating layer IL may be processed at the time of removing the first insulating layer IL by using the second laser L2. Therefore, it is possible to prevent the occurrence of unnecessary glass powder or glass particles.

When the second laser L2 is emitted, the conductive film SL and the second insulating layer PL may be removed in smaller amount than the first insulating layer IL.

The second insulating layer PL may have lower reactivity to the second laser L2 than the first insulating layer IL, and the second laser L2 may be supplied through a gap between the first insulating layer IL and the second insulating layer PL. Therefore, the width of the upper hole Hb formed in the second insulating layer PL may be large at the lower side adjacent to the first insulating layer IL and gradually decreases upward.

The third width W3 of the uppermost portion of the via hole HL may be larger than the fourth width W4 of the uppermost portion of the sub-hole SHL.

Figure 4:
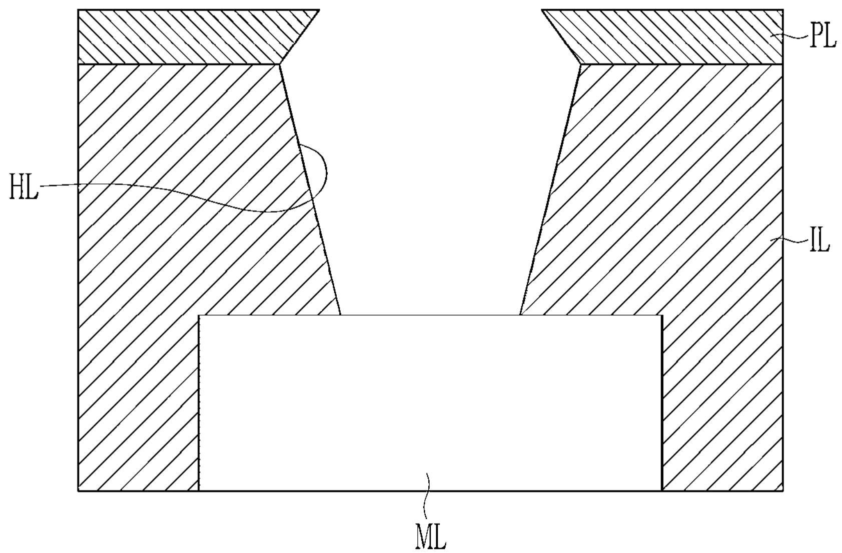

Next, as illustrated in FIG. 4, the conductive film SL disposed on the second insulating layer PL may be removed.

Figure 5:
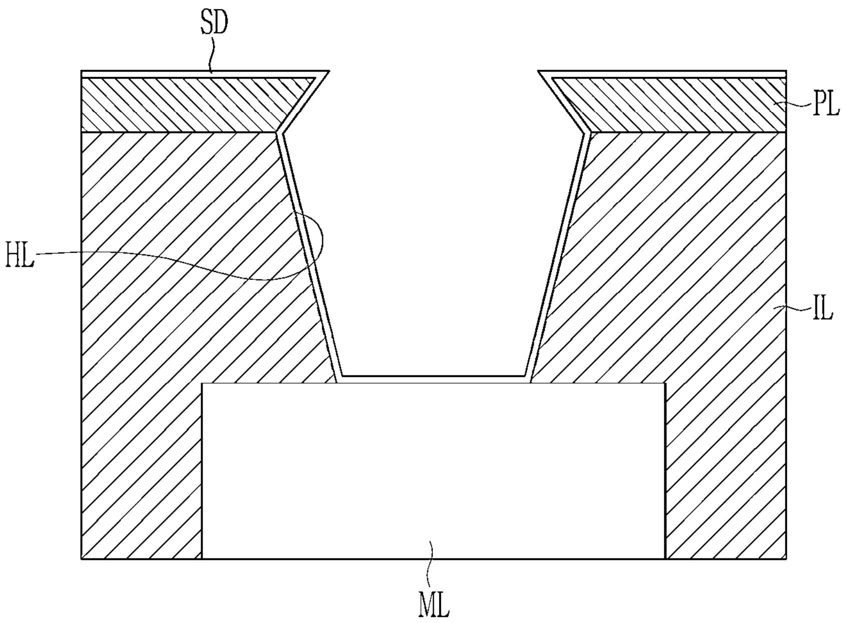

Referring to FIG. 5, a plating seed layer SD is formed on an upper surface of the lower conductive pattern ML, a lateral surface of the via hole HL formed in the first insulating layer IL and the second insulating layer PL, and an upper surface of the second insulating layer PL.

Figure 6:
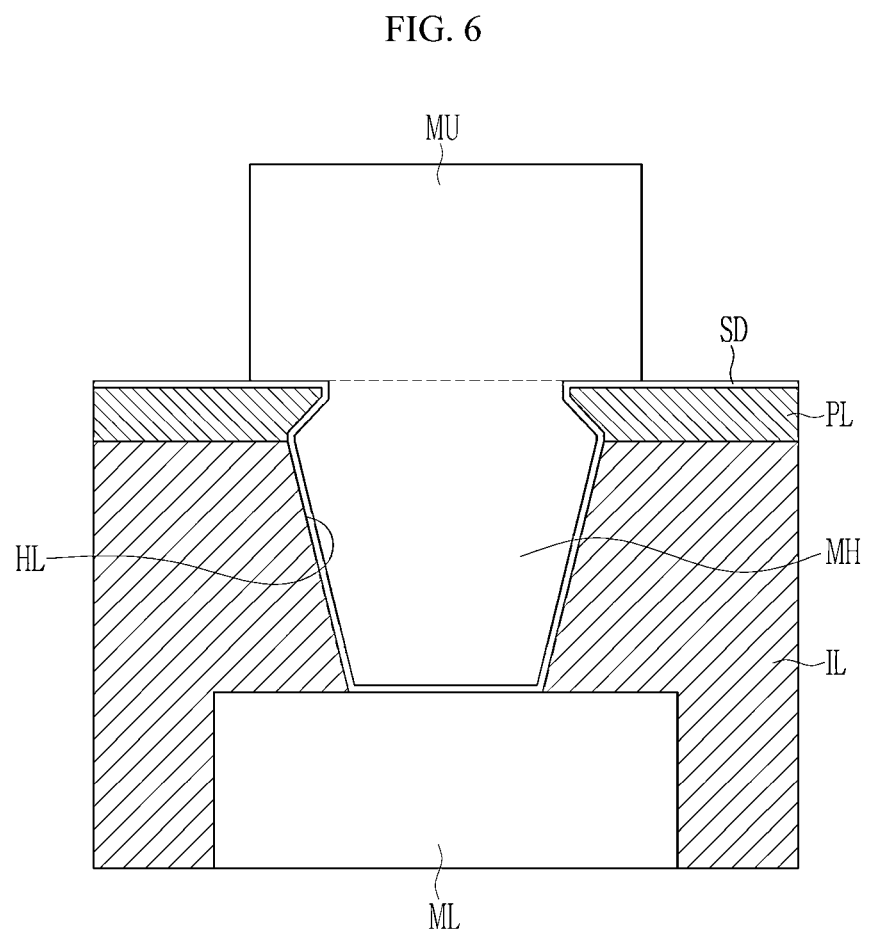

As illustrated in FIG. 6, by plating, the connection conductive pattern MH is formed in the via hole HL formed in the first insulating layer IL and the second insulating layer PL, and the upper conductive pattern MU is formed on the connection conductive pattern MH in the via hole HL.

Next, the substrate illustrated in FIG. 1 is formed by removing the plating seed layer SD that does not overlap the upper conductive pattern MU.

According to the method of manufacturing the substrate according to the present embodiment, the sub-hole SHL is formed by primarily removing the first insulating layer IL and the second insulating layer PL by using the first laser L1, and the via hole HL including the lower hole Ha and the upper hole Hb may be formed by secondarily removing the first insulating layer IL and the second insulating layer PL by using the second laser L2.

Therefore, the via hole HL may have the first width W1 at a lowermost portion where the via hole HL adjoins the lower conductive pattern ML. The width of the via hole HL may increase in the direction from the lower conductive pattern ML toward the upper conductive pattern MU. The via hole HL may have the second width W2 at the interface portion between the first insulating layer IL and the second insulating layer PL. The width of the via hole HL may decrease in the direction from the second width W2 toward the upper conductive pattern MU. The via hole HL may have the third width W3 at the uppermost portion where the via hole HL adjoins the upper conductive pattern MU. The first width W1 and the third width W3 may be smaller than the second width W2.

In case that only one laser is used to form the via hole HL, a degree to which the plurality of layers, in which the via hole HL is to be formed, reacts with the laser may vary depending on the plurality of layers. According to the method of manufacturing the substrate according to the present embodiment, the different first and second lasers are used to remove the first insulating layer IL and the second insulating layer PL in which the via hole HL is formed. Therefore, the via hole HL may be formed such that the via hole HL has the relatively large second width W2 in the via hole HL, and the via hole HL has the relatively small first and third widths W1 and W3 at the lowermost and uppermost portions of the via hole HL.

Figure 7:
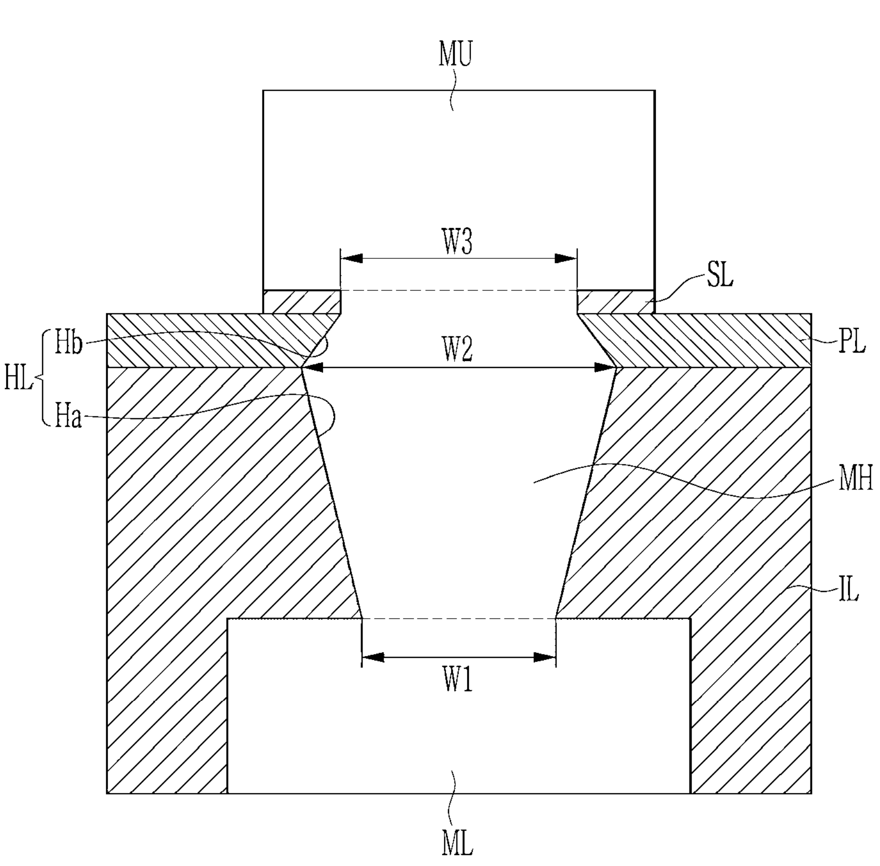
FIG. 7 is a cross-sectional view of a substrate according to another embodiment.

Then, a substrate according to another embodiment will be described with reference to FIG. 7. FIG. 7 is a cross-sectional view of a substrate according to another embodiment.

Referring to FIG. 7, the substrate according to the present embodiment is similar to the substrate according to the embodiment previously described with reference to FIG. 1. A specific description of the identical constituent elements will be omitted.

Unlike the embodiment illustrated in FIG. 1, in the substrate according to the present embodiment, the conductive film SL may be disposed between the second insulating layer PL and the upper conductive pattern MU, and the via hole HL may be formed in the first insulating layer IL, the second insulating layer PL, and the conductive film SL.

The conductive film SL may be, but not limited to, a metal coil layer, for example, a copper coil layer.

The via hole HL may include the lower hole Ha formed in the first insulating layer IL while adjoining the lower conductive pattern ML, and the upper hole Hb formed in the second insulating layer PL and the conductive film SL while adjoining the upper conductive pattern MU. The lower hole Ha and the upper hole Hb are connected to each other.

The lower hole Ha has the first width W1 at the portion where the lower hole Ha adjoins the lower conductive pattern ML. The width of the lower hole Ha may increase in the direction toward the upper conductive pattern MU from the portion where the lower hole Ha adjoins the lower conductive pattern ML. According to the illustrated embodiment, the configuration is illustrated in which the width of the lower hole Ha continuously and gradually increases in the direction toward the upper conductive pattern MU from the portion where the lower hole Ha adjoins the lower conductive pattern ML. However, the embodiment is not limited thereto. A sidewall of the lower hole Ha may include a partially protruding portion, such that the lower hole Ha may include a portion having upper and lower sides, the upper side being smaller in width than the lower side.

The via hole HL may have the second width W2 at the interface portion between the first insulating layer IL and the second insulating layer PL where the lower hole Ha and the upper hole Hb meet. The width of the upper hole Hb formed in the second insulating layer PL and the conductive film SL may decrease in the direction toward the upper conductive pattern MU. The upper hole Hb may have the third width W3 at the portion where the upper hole Hb adjoins the upper conductive pattern MU. According to the illustrated embodiment, the configuration is illustrated in which the width of the upper hole Hb continuously and gradually decreases in the direction toward the upper conductive pattern MU. However, the embodiment is not limited thereto. The sidewall of the upper hole Hb may include a partially protruding portion, such that the upper hole Hb may include a portion having upper and lower sides, the upper side being larger in width than the lower side.

The first width W1 and the third width W3 of the via hole HL may be almost equal to each other. Alternatively, the first width W1 and the third width W3 may be different from each other.

The portion of the upper hole Hb, which is formed in the conductive film SL, does not have a smaller width than the portion of the upper hole Hb formed in the second insulating layer PL. The conductive film SL does not protrude toward the inside of the via hole HL.

According to the substrate according to the present embodiment, the via hole HL may include the lower hole Ha formed in the first insulating layer IL, and the upper hole Hb formed in the second insulating layer PL and the conductive film SL. The lower hole Ha may have the first width W1 at the portion where the lower hole Ha adjoins the lower conductive pattern ML. The width of the lower hole Ha increases in the direction toward the upper conductive pattern MU from the portion where the lower hole Ha adjoins the lower conductive pattern ML. The via hole HL may have the second width W2 at the interface portion between the first insulating layer IL and the second insulating layer PL where the lower hole Ha and the upper hole Hb meet. The width of the upper hole Hb formed in the second insulating layer PL may decrease in the direction toward the upper conductive pattern MU. The upper hole Hb may have the third width W3 at the portion where the upper hole Hb adjoins the upper conductive pattern MU.

As described above, the via hole HL may have the relatively small first and third widths W1 and W3 at the portions where the via hole HL adjoins the lower and upper conductive patterns ML and MU. The via hole HL may have the relatively large second width W2 in the via hole HL. Therefore, the connection conductive pattern MH formed in the via hole HL may be formed in the portion having the relatively large second width W2, thereby preventing the occurrence of disconnection or the like. The lower conductive pattern ML and the upper conductive pattern MU, which are connected to each other through the connection conductive pattern MH formed in the via hole HL, may cover the via hole HL while having the small widths, thereby reducing an area of the lower conductive pattern ML embedded in the first insulating layer IL and reducing an area of the upper conductive pattern MU formed on the second insulating layer PL.

According to the substrate according to the present embodiment, a decrease in width of the interior of the via hole HL may be prevented. Therefore, it is possible to reduce a defect of the connection conductive pattern MH caused by the decrease in width of the interior of the via hole HL. Further, it is possible to prevent the increase in areas of the lower and upper conductive patterns ML and MU disposed below and above the via hole.

Then, a method of manufacturing the substrate according to another embodiment will be described with reference to FIGS. 7 and 8 to 11. FIGS. 8 to 11 are cross-sectional views illustrating a method of manufacturing the substrate according to another embodiment.

Figure 8:
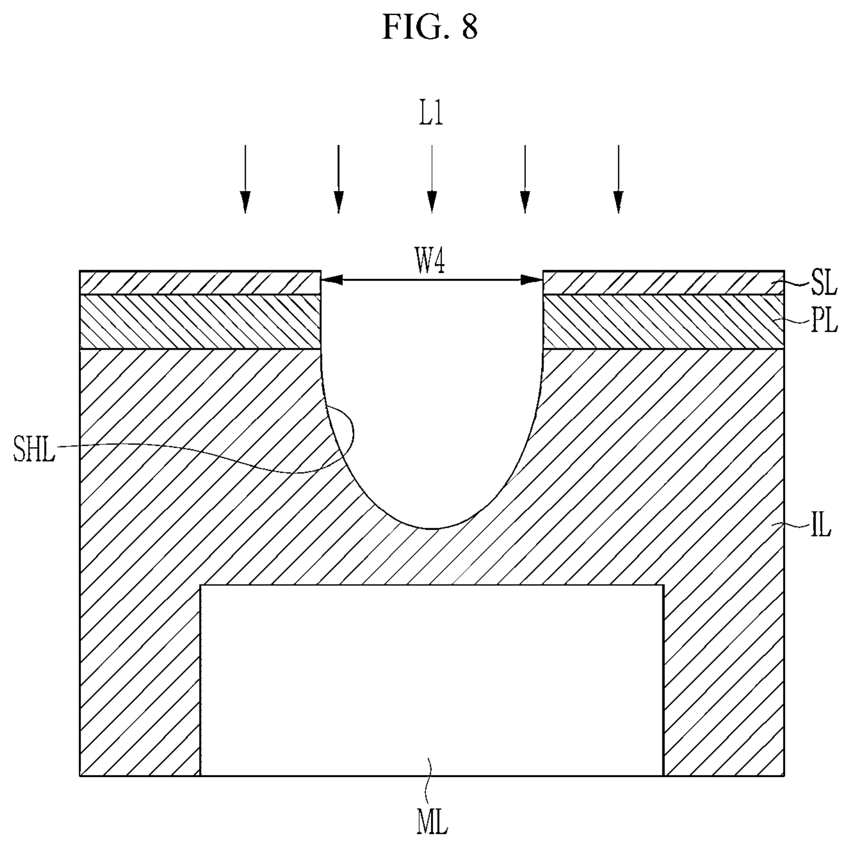
FIGS. 8 to 11 are cross-sectional views illustrating a method of manufacturing the substrate according to another embodiment.

Referring to FIG. 8, the lower conductive pattern ML is formed, the first insulating layer IL is stacked on the lower conductive pattern ML, the second insulating layer PL is formed on the first insulating layer IL, the conductive film SL is formed on the second insulating layer PL, and then the conductive film SL, the second insulating layer PL, and the first insulating layer IL are removed by emitting the first laser L1, such that the sub-hole SHL is formed in the conductive film SL, the second insulating layer PL, and the first insulating layer IL.

The first laser L1 may be a YAG laser.

The uppermost portion of the sub-hole SHL may have the fourth width W4, the sub-hole SHL may be formed in the conductive film SL, the second insulating layer PL, and a part of the first insulating layer IL, the lower conductive pattern ML may not be exposed through the sub-hole SHL, and a part of the first insulating layer IL may remain on the lower conductive pattern ML.

Figure 9:
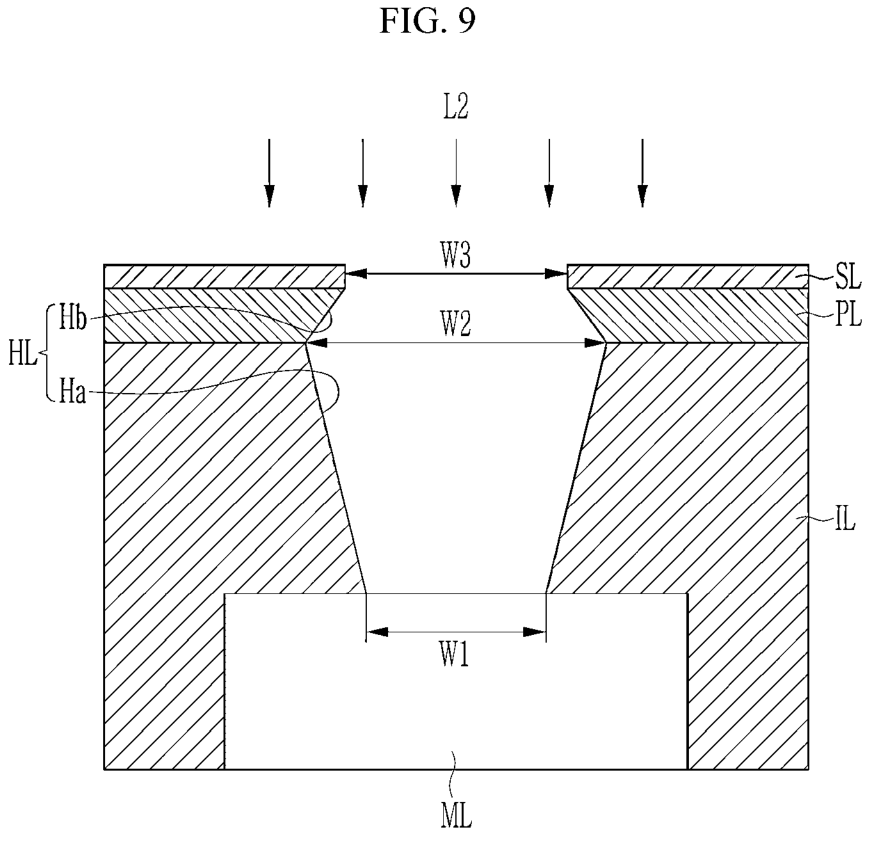

Next, referring to FIG. 9, the conductive film SL, the second insulating layer PL, and the first insulating layer IL are additionally removed by emitting a second laser L2, such that the via hole HL is formed in the conductive film SL, the second insulating layer PL, and the first insulating layer IL so that the lower conductive pattern ML is exposed.

The second laser L2 may be a carbon dioxide ($CO_2$) gas laser. The fiberglass in the first insulating layer IL may be processed at the time of removing the first insulating layer IL by using the second laser L2. Therefore, it is possible to prevent the occurrence of unnecessary glass powder or glass particles.

The second insulating layer PL and the conductive film SL may have lower reactivity to the second laser L2 than the first insulating layer IL. When the second laser L2 is emitted, the conductive film SL and the second insulating layer PL may be removed in smaller amount than the first insulating layer IL. Therefore, the width of the upper hole Hb formed in the conductive film SL may be smaller than a width of an upper side of the lower hole Ha formed in the first insulating layer IL.

In addition, the second laser L2 may be supplied through a gap between the first insulating layer IL and the second insulating layer PL. Therefore, the width of the upper hole Hb formed in the second insulating layer PL may be large at the lower side adjacent to the first insulating layer IL and gradually decreases upward.

The third width W3 of the uppermost portion of the via hole HL may be larger than the fourth width W4 of the uppermost portion of the sub-hole SHL.

Figure 10:
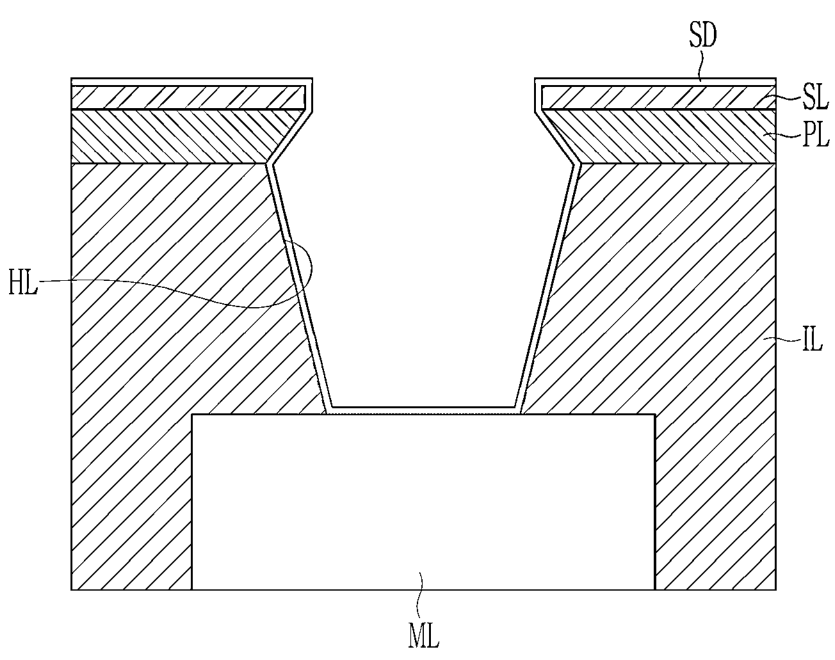

Next, as illustrated in FIG. 10, the plating seed layer SD is formed on the upper surface of the lower conductive pattern ML, the lateral surface of the via hole HL formed in the conductive film SL, the second insulating layer PL, and the first insulating layer IL, and the upper surface of the conductive film SL.

Figure 11:
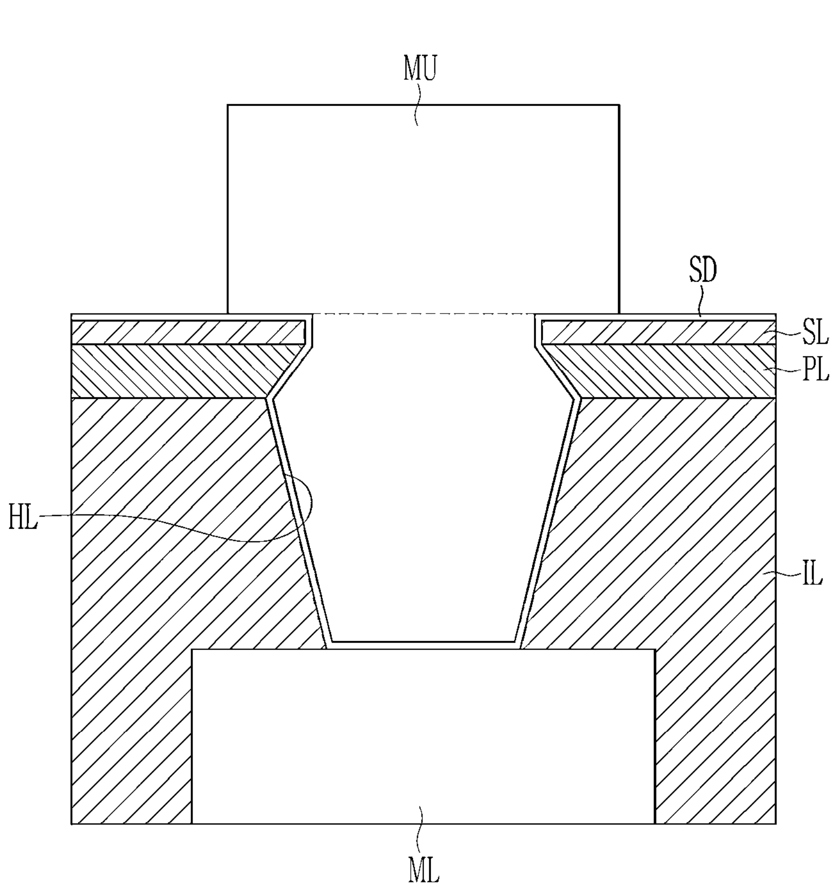

As illustrated in FIG. 11, by plating, the connection conductive pattern MH is formed in the via hole HL, and the upper conductive pattern MU is formed on the connection conductive pattern MH in the via hole HL.

Next, the substrate illustrated in FIG. 7 is formed by removing the conductive film SL and the plating seed layer SD that does not overlap the upper conductive pattern MU.

According to the method of manufacturing the substrate according to the present embodiment, the sub-hole SHL may be formed by primarily removing the conductive film SL, the second insulating layer PL, and the first insulating layer IL by using the first laser L1, and the via hole HL including the lower hole Ha and the upper hole Hb may be formed by secondarily removing the conductive film SL, the second insulating layer PL, and the first insulating layer IL by using the second laser L2.

Therefore, the via hole HL may have the first width W1 at a lowermost portion where the via hole HL adjoins the lower conductive pattern ML. The width of the via hole HL may increase in the direction from the lower conductive pattern ML toward the upper conductive pattern MU. The via hole HL may have the second width W2 at the interface portion between the first insulating layer IL and the second insulating layer PL. The width of the via hole HL may decrease in the direction from the second width W2 toward the upper conductive pattern MU. The via hole HL may have the third width W3 at the uppermost portion where the via hole HL adjoins the upper conductive pattern MU. The first width W1 and the third width W3 may be smaller than the second width W2.

In case that only one laser is used to form the via hole HL, a degree to which the plurality of layers, in which the via hole HL is to be formed, reacts with the laser may vary depending on the plurality of layers. According to the method of manufacturing the substrate according to the present embodiment, the different first and second lasers are used to remove the first insulating layer IL and the second insulating layer PL in which the via hole HL is formed. Therefore, the via hole HL may be formed such that the via hole HL has the relatively large second width W2 in the via hole HL, and the via hole HL has the relatively small first and third widths W1 and W3 at the lowermost and uppermost portions of the via hole HL.

All the plurality of features of the method of manufacturing the substrate according to the embodiment previously described with reference to FIGS. 1 and 2 to 6 may be applied to the method of manufacturing the substrate according to the present embodiment.

Then, an experimental example will be described with reference to FIGS. 12 to 14. In the present experimental example, the substrate is manufactured according to the method of manufacturing the substrate according to the embodiment previously described with reference to FIGS. 1 and 2 to 6, and electron microscope photographs indicating the results of the experimental example are illustrated in FIGS. 12 to 14.

Figure 12:
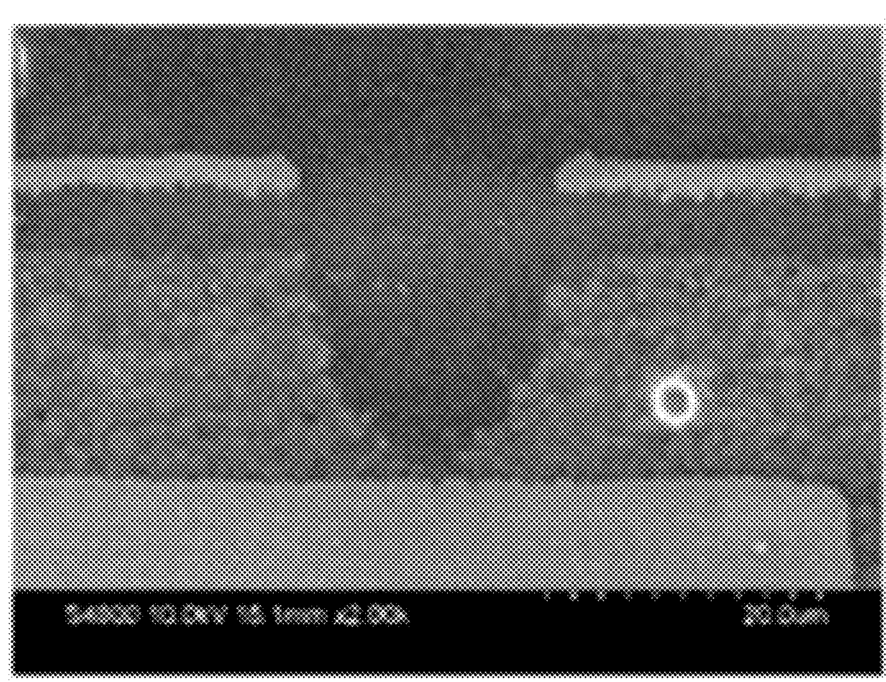
FIGS. 12 to 14 are electron microscope photographs illustrating a result of an experimental example.

FIG. 12 illustrates a result of forming the sub-hole SHL by emitting the first laser L1 as illustrated in FIG. 2. FIG. 13 illustrates a result of forming the via hole HL by emitting the second laser L2 as illustrated in FIG. 3. FIG. 14 illustrates a result of forming the connection conductive pattern MH disposed in the via hole HL and the upper conductive pattern MU disposed above the via hole HL as illustrated in FIG. 6.

Figure 13:
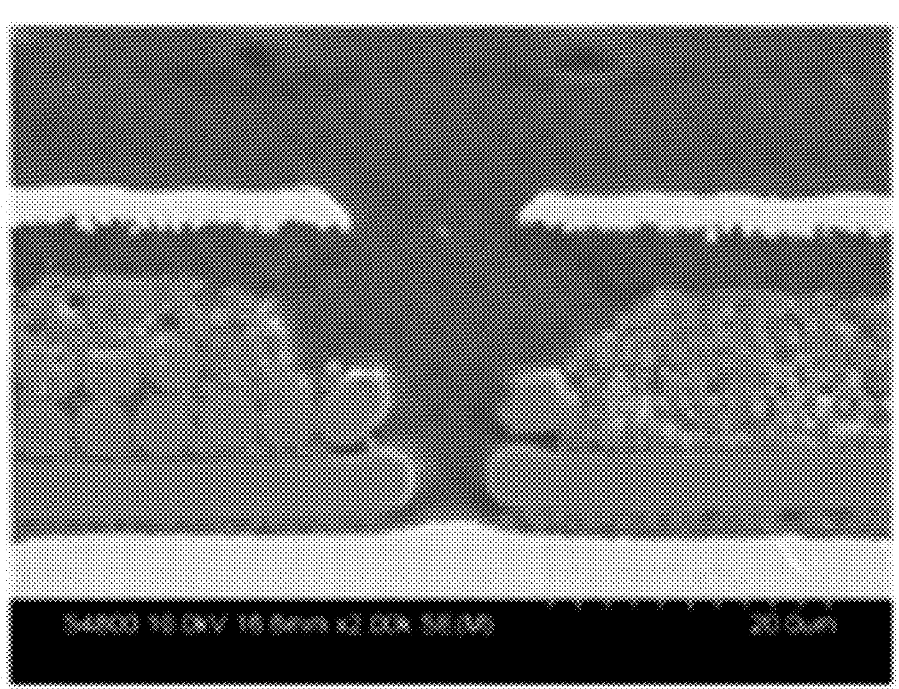
Figure 14:
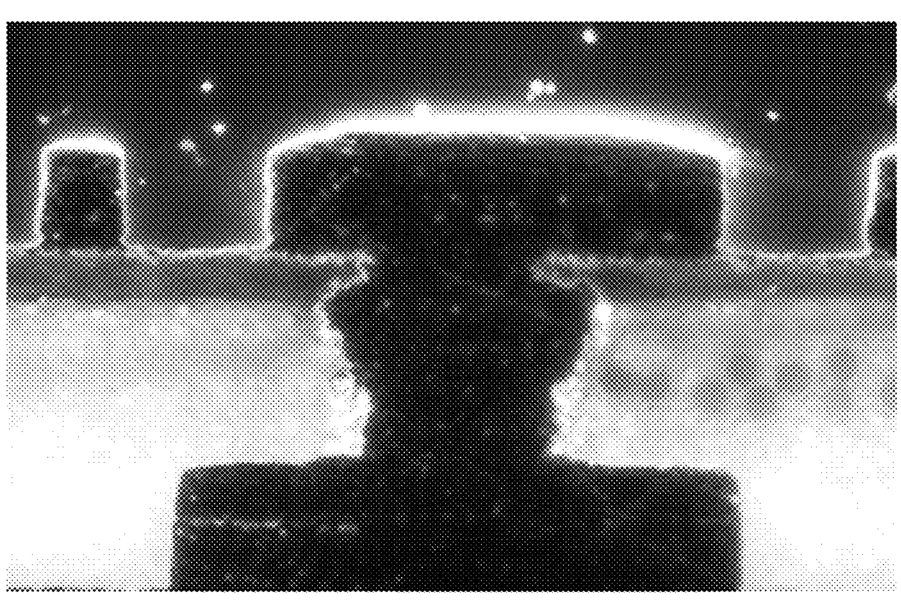

Referring to FIGS. 12 to 14, according to the method of manufacturing the substrate according to the embodiment, it can be seen that the via hole HL has the small width at the lowermost portion where the via hole HL adjoins the lower conductive pattern ML, the width of the via hole HL increases in the direction from the lower conductive pattern ML toward the upper conductive pattern MU, the via hole HL has the large width at the interface portion between the first insulating layer IL and the second insulating layer PL, and the width of the via hole HL decreases in the direction from the second width W2 toward the upper conductive pattern MU, such that the via hole HL is appropriately formed without a defect such as disconnection or insufficient filling of the connection conductive pattern in the via hole HL.

While the embodiments have been described above, the present disclosure is not limited thereto, and various modifications can be made and carried out within the scope of the claims, the detailed description of the embodiments, and the accompanying drawings, and also fall within the scope of the embodiments.

DESCRIPTION OF SYMBOLS

HL: Via hole
Ha: Lower hole
Hb: Upper hole
SHL: Sub-hole
ML: Lower conductive pattern
MU: Upper conductive pattern
MH: Connection conductive pattern
IL: First insulating layer
PL: Second insulating layer
SL: Conductive film
L1, L2: Laser

What is claimed is:

1. A substrate comprising:
a first insulating layer;
a second insulating layer disposed on the first insulating layer; and
a via hole including a lower hole formed in the first insulating layer, and an upper hole formed in the second insulating layer and connected to the lower hole,
wherein a width of an upper side of the lower hole is larger than a width of a lower side of the lower hole, and a width of an upper side of the upper hole is smaller than a width of a lower side of the upper hole,
wherein the width of the upper side of the lower hole is equal to the width of the lower side of the upper hole, and
wherein a thickness of the first insulating layer is greater than a thickness of the second insulating layer.

2. The substrate of claim 1, further comprising:
a lower conductive pattern disposed at a lower portion of the first insulating layer; and
an upper conductive pattern disposed above the second insulating layer,
wherein the lower hole has a first width at a portion where the lower hole adjoins the lower conductive pattern,
wherein the via hole has a second width between the lower conductive pattern and the upper conductive pattern,
wherein the upper hole has a third width at a portion where the upper hole adjoins the upper conductive pattern, and
wherein each of the first width and the third width is smaller than the second width.

3. The substrate of claim 2, wherein:
the second width is largest at an interface between the first insulating layer and the second insulating layer.

4. The substrate of claim 2, further comprising:
a connection conductive pattern disposed in the via hole and connected to the lower conductive pattern and the upper conductive pattern.

5. The substrate of claim 1, wherein:

a width of the lower hole increases from the lower side to the upper side of the lower hole, and a width of the upper hole decreases from the lower side to the upper side of the upper hole.

6. The substrate of claim 5, wherein:

the first insulating layer includes prepreg and is impregnated with fiberglass.

7. The substrate of claim 1, wherein:

the first insulating layer includes a reinforcing material, and the second insulating layer includes no reinforcing material.

8. The substrate of claim 1, wherein:

the second insulating layer includes resin.

9. The substrate of claim 1, further comprising:

a conductive film disposed on the second insulating layer, wherein the upper hole is formed in the second insulating layer and the conductive film.

10. The substrate of claim 9, wherein:

a width of the upper hole formed in the conductive film is not smaller than a width of the upper hole formed in the second insulating layer.

11. A method of manufacturing a substrate, the method comprising:

stacking a first insulating layer;

forming a second insulating layer on the first insulating layer, the second insulating layer having a thickness less than a thickness of the first insulating layer;

forming a sub-hole by primarily removing the second insulating layer and the first insulating layer by emitting a first laser; and forming a via hole by secondarily removing the second insulating layer and the first insulating layer by emitting a second laser different from the first laser, wherein the forming of the via hole comprises forming a lower hole in the first insulating layer and an upper hole in the second insulating layer to connect the upper and lower holes to each other, wherein a width of an upper side of the lower hole is larger than a width of a lower side of the lower hole, and a width of an upper side of the upper hole is smaller than a width of a lower side of the upper hole, and wherein the width of the upper side of the lower hole is equal to the width of the lower side of the upper hole.

12. The method of claim 11, wherein:

the first laser is a YAG laser, and the second laser is a carbon dioxide gas laser.

13. The method of claim 12, wherein:

the first insulating layer is impregnated with fiberglass, and the fiberglass of the first insulating layer is processed in the emitting of the second laser.

14. The method of claim 12, further comprising:

forming a lower conductive pattern below the first insulating layer;

forming a connection conductive pattern in the via hole, the connection conductive pattern being connected to the lower conductive pattern; and forming an upper conductive pattern above the via hole, the upper conductive pattern being connected to the connection conductive pattern.

15. The method of claim 14, wherein:

the forming of the connection conductive pattern comprises:

stacking a plating seed layer on an upper surface of the lower conductive pattern and an inner wall of the via hole; and performing plating by using the plating seed layer.

16. The method of claim 15, further comprising:

forming a conductive film on the second insulating layer, wherein the sub-hole and the via hole are formed in the conductive film.

17. The method of claim 16, further comprising:

removing the conductive film before the plating seed layer is formed.

18. The method of claim 16, further comprising:

removing a portion of the conductive film, which does not overlap the upper conductive pattern, after the upper conductive pattern is formed.

19. The method of claim 11, wherein:

a width of the via hole is largest at an interface between the first insulating layer and the second insulating layer.

20. A substrate comprising:

at least one insulating layer including a first insulating layer and a second insulating layer stacked on one another;

a lower conductive pattern and an upper conductive pattern disposed at a lower portion and an upper portion of the at least one insulating layer, respectively; and a connection conductive pattern penetrating through the at least one insulating layer to be connected to the lower and upper conductive patterns, wherein a width of a middle portion of the connection conductive pattern is larger than widths of upper and lower portions of the connection conductive pattern, wherein the connection conductive pattern includes a lower connection conductive pattern and an upper connection conductive pattern extended from the lower connection conductive pattern, wherein a width of an upper side of the lower connection conductive pattern is larger than a width of a lower side of the lower connection conductive pattern, and a width of an upper side of the upper connection conductive pattern is smaller than a width of a lower side of the upper connection conductive pattern, wherein the width of the upper side of the lower connection conductive pattern is equal to the width of the lower side of the upper connection conductive pattern, wherein the lower connection conductive pattern is disposed in the first insulating layer and the upper connection conductive pattern is disposed in the second insulating layer, and wherein a thickness of the first insulating layer is greater than a thickness of the second insulating layer.

21. The substrate of claim 20, further comprising a via hole in which the connection conductive pattern is disposed, the via hole including a lower hole and an upper hole connected to each other, wherein the lower hole is formed in the first insulating layer and the upper hole is formed in the second insulating layer, and the lower connection conductive pattern is disposed in the lower hole and the upper connection conductive pattern is disposed in the upper hole.

22. The substrate of claim 21, wherein a width of the via hole is largest at an interface between the first insulating layer and the second insulating layer.

23. The substrate of claim 20, wherein a largest width of the connection conductive pattern is closer to an interface between the connection conductive pattern and the upper conductive pattern than an interface between the connection conductive pattern and the lower conductive pattern.

24. The substrate of claim 20, wherein a width of the connection conductive pattern at an interface between the connection conductive pattern and the upper conductive pattern is larger than a width of the connection conductive pattern at an interface between the connection conductive pattern and the lower conductive pattern.

25. The substrate of claim 20, wherein the lower conductive pattern is embedded in the lower portion of the at least one insulating layer, and the upper conductive pattern is disposed above the upper portion of the at least one insulating layer.

26. The substrate of claim 20, further comprising a conductive film disposed between the at least one insulating layer and the upper conductive pattern.

* * * * *